(12) United States Patent
Kinlen (10) Patent No.: US 11,965,116 B2
(45) Date of Patent: Apr. 23, 2024

(54) SYSTEMS, COMPOSITIONS, AND METHODS FOR ENHANCED ELECTROMAGNETIC SHIELDING AND CORROSION RESISTANCE

(71) Applicant: THE BOEING COMPANY, Chicago, IL (US)

(72) Inventor: Patrick John Kinlen, Fenton, MO (US)

(73) Assignee: THE BOEING COMPANY, Arlington, VA (US)

( * ) Notice: Subject to any disclaimer, the term of this patent is extended or adjusted under 35 U.S.C. 154(b) by 107 days.

(21) Appl. No.: 17/707,650

(22) Filed: Mar. 29, 2022

(65) Prior Publication Data
US 2022/0220323 A1 Jul. 14, 2022

Related U.S. Application Data

(62) Division of application No. 16/697,296, filed on Nov. 27, 2019, now Pat. No. 11,414,555.
(Continued)

(51) Int. Cl.
*C09D 5/32* (2006.01)
*C09D 5/08* (2006.01)
(Continued)

(52) U.S. Cl.
CPC .............. *C09D 5/32* (2013.01); *C09D 5/084* (2013.01); *C09D 5/24* (2013.01); *C09D 7/70* (2018.01);
(Continued)

(58) Field of Classification Search
CPC . C09D 5/32; C09D 5/084; C09D 5/24; C09D 7/62; C09D 7/70; C09D 179/02; H01B 1/124; H05K 9/0081
(Continued)

(56) References Cited

U.S. PATENT DOCUMENTS 6,379,589 B1 * 4/2002 Aldissi ..................... B22F 1/18
148/108
9,771,483 B2 9/2017 Kinlen et al.
(Continued)

FOREIGN PATENT DOCUMENTS

CN 1710040 A 12/2005
CN 108837801 A 11/2018
(Continued)

OTHER PUBLICATIONS

Naeimeh Bahri-Laleh, Khadijeh Didehban, Elham Yarahmadi, Seyed Amin Mirmohammadi and Guowei Wang, "Microwave Absorption Properties of Polyaniline/Carbonyl Iron Composites," Oct. 14, 2017, 7 pages.
(Continued)

*Primary Examiner* — Tri V Nguyen
(74) *Attorney, Agent, or Firm* — Patterson + Sheridan, LLP (57) ABSTRACT

Aspects of the present disclosure provide a coating composition that includes a polymer material comprising an electrically conductive polymer; and a coated or partially coated magnetic material comprising a magnetic material and an antioxidant material. Aspects of the present disclosure further provide a method of making a coating composition that includes introducing, under first conditions, a magnetic material to a passivation solution comprising an antioxidant to form a coated (or partially coated) magnetic material; and introducing, under second conditions, the coated (or partially coated) magnetic material to a mixture comprising a polymer material to form a coating composition. Aspects of the present disclosure further provide a coated substrate that includes a film and a substrate, the film including a coating composition that includes an electrically conductive polymer, a magnetic material, and an antioxidant.

20 Claims, 5 Drawing Sheets

Related U.S. Application Data (60) Provisional application No. 62/882,785, filed on Aug. 5, 2019.

(51) Int. Cl.
*C09D 5/24* (2006.01)
*C09D 7/40* (2018.01)
*C09D 179/02* (2006.01)
*H01B 1/12* (2006.01)
*H01B 1/22* (2006.01)
*H05K 9/00* (2006.01)

(52) U.S. Cl.
CPC ........... *C09D 179/02* (2013.01); *H01B 1/124* (2013.01); *H01B 1/22* (2013.01); *H05K 9/0081* (2013.01)

(58) Field of Classification Search
USPC .......................... 252/500, 510, 511; 428/457
See application file for complete search history.

(56) References Cited

U.S. PATENT DOCUMENTS

| | | | | |
|---|---|---|---|---|
| 2003/0219598 A1* | 11/2003 | Sakurai | ................. | C09D 5/032 428/403 |
| 2004/0105980 A1 | 6/2004 | Sudarshan et al. | | |
| 2008/0050594 A1 | 2/2008 | Schuster et al. | | |
| 2014/0378016 A1 | 12/2014 | Leddy et al. | | |
| 2015/0235745 A1* | 8/2015 | Choe | ........................ | H01F 1/26 427/127 |

FOREIGN PATENT DOCUMENTS

| | | |
|---|---|---|
| EP | 0162979 A1 | 12/1985 |
| EP | 3480340 A1 | 5/2019 |

OTHER PUBLICATIONS

Esmaeilzar et al., "Corrosion and magnetic properties of encapsulated carbonyl iron particles in aqueous suspension by inorganic thin films for magnetorheological finishing applicaton," Applied Surface Science 436 (2018) 1200-1212.

Extended European Search Report for Application No. 20189487. 01-1102/3778786 dated Jan. 20, 2021.

Li "Microwave absorption properties of ?- Fe2O3/(SiO2)x-SO3H/polypyrrole core/shell/shell microspheres." J Mater Sci (2018) 53: 5270-5286 (Year: 2018).

Wang "Preparation of CIP/SiO2/PANI Composites and design of electromagnetic wave absorption coating in X-Band." Advanced Materials Research, vols. 846-847, pp. 1905-1910 (Year: 2013).

* cited by examiner

SYSTEMS, COMPOSITIONS, AND METHODS FOR ENHANCED ELECTROMAGNETIC SHIELDING AND CORROSION RESISTANCE

CROSS-REFERENCES TO RELATED APPLICATIONS

This application is a divisional of co-pending U.S. patent application Ser. No. 16/697,296, filed Nov. 27, 2019, which claims priority to U.S. Provisional Patent Application No. 62/882,785, filed Aug. 5, 2019, each of which is incorporated herein by reference in their entireties.

FIELD

Aspects of the present disclosure relate generally to systems and compositions for electromagnetic shielding and corrosion resistance, and to methods of making such systems and compositions.

BACKGROUND

Shielding against electromagnetic radiation is valuable in a myriad of applications including: commercial, military, scientific, electronic, and communication systems. Compositions that include magnetic materials, can be used for the design of magnetic type electromagnetic wave absorbers. However, a drawback to the use of magnetic materials, e.g., carbonyl iron, is its susceptibility to oxidation and corrosion, particularly at higher temperatures and/or in acidic environments, which leads to decreased electromagnetic properties and stability of the materials. Another drawback to using magnetic materials is its weight. In order for a composition containing magnetic material, e.g., carbonyl iron, to achieve a desired level of electromagnetic absorption properties, the compositions are loaded with substantial amounts of carbonyl iron. Using carbonyl iron in, e.g., a coating composition, can therefore be problematic in applications—such as aircraft, spacecraft, watercraft, land vehicle, and satellite systems—where the compositions should be lightweight.

There exists a need for improved electromagnetic wave absorbing compositions having corrosion resistance and enhanced electromagnetic shielding.

SUMMARY

Aspects of the present disclosure provide a coating composition that includes a polymer material comprising an electrically conductive polymer; and a coated or partially coated magnetic material comprising a magnetic material and an antioxidant material.

Aspects of the present disclosure further provide a method of making a coating composition that includes introducing, under first conditions, a magnetic material to a passivation solution comprising an antioxidant to form a coated (or partially coated) magnetic material; and introducing, under second conditions, the coated (or partially coated) magnetic material to a mixture comprising a polymer material to form a coating composition.

Aspects of the present disclosure further provide a coated substrate includes a film and a substrate, the film including a coating composition that includes an electrically conductive polymer, a magnetic material, and an antioxidant.

BRIEF DESCRIPTION OF THE DRAWINGS

So that the manner in which the above recited features can be understood in detail, a more particular description, briefly summarized above, may be had by reference to example aspects, some of which are illustrated in the appended drawings. It is to be noted, however, that the appended drawings illustrate only exemplary aspects and are therefore not to be considered limiting of its scope, for the disclosure may admit to other equally effective aspects.

DETAILED DESCRIPTION

The present disclosure generally relates to a coating composition that can provide corrosion resistance and improved electromagnetic properties. The inventor has discovered that passivation of a magnetic material (e.g., ferrite and/or carbonyl iron) with an antioxidant material (e.g., cerium oxide) formulated in an electrically-conductive polymer provides a stable, corrosion-resistant coating composition useful for coating various substrates. The use of an antioxidant material to at least partially cover (or encapsulate) the magnetic material minimizes, or eliminates, problems such as corrosion, oxidation, and decreased electromagnetic properties of the magnetic material. In addition, corrosion resistance to the acidic environment of the polymer material is provided by the antioxidant material that at least partially covers the carbonyl iron. Thus, use of the antioxidant material promotes stability of the magnetic material. Moreover, the inventor has discovered that the use of an electrically-conductive polymer in the coating composition enables the coating composition to maintain excellent electromagnetic properties while being lightweight due to including less magnetic material. To achieve desired levels of electromagnetic absorption properties, conventional coating compositions would need to be loaded with substantial amounts of a heavy and dense magnetic material. However, loading a coating composition with a heavy and dense material limits its operability and usefulness as a coating composition. Thus, the use of an electrically-conductive polymer allows for a reduction in the amount of magnetic material in the coating composition, thereby improving the operability and broad-range applicability of the coating composition. Such applications include use as a coating composition to coat, e.g., aircraft, spacecraft, watercraft, land vehicle, and satellite systems. In some embodiments, the coating composition can enhance radar absorption.

Conventional coating compositions to coat portions of aircraft, for example, have powders blended into polyurethane or epoxies, and are then used as paints. Such coating compositions are insulative and not conductive. Carbonyl iron/polyaniline coating compositions, and methods of making such coating compositions, have been formulated but have severe drawbacks. One such composition was prepared by polymerization of aniline on the carbonyl iron particle in a medium that includes hydrochloric acid. The carbonyl iron particle was then dispersed in an epoxy coating. Unlike this comparative composition, the example coating composition disclosed herein includes a passivated carbonyl iron particle blended into a soluble polyaniline (no epoxy) to form a coating. There is no need to polymerize polyaniline on the passivated carbonyl iron particle to formulate the example coating compositions disclosed herein. Indeed, the hydrochloric acid could react with cerium oxide in the example coating compositions described herein and destroy the oxide layer that protects the carbonyl iron.

For purposes of this disclosure, and unless otherwise indicated, a "composition" includes components of the composition and/or reaction products of two or more components of the composition. Similarly, a "coating composition" includes components of the coating composition and/or reaction products of two or more components of the coating composition.

For purposes of this disclosure and unless otherwise indicated, all numbers indicating quantities are to be understood as being modified by the term "about" in all instances. It should also be understood that the numerical values used in the specification and claims constitute specific aspects. Efforts have been made to ensure the accuracy of the data in the examples. However, it should be understood that any measured data inherently contain a certain level of error due to the limitation of the technique and equipment used for making the measurement.

As used herein, the indefinite article "a" or "an" shall mean "at least one" unless specified to the contrary or the context clearly indicates otherwise. For example, aspects comprising "a magnetic material" include aspects comprising one, two, or more magnetic materials, unless specified to the contrary or the context clearly indicates only one magnetic material is included.

Coating Compositions

In at least one aspect, the coating composition can include a polymer material, a magnetic material, and an antioxidant material. The magnetic material (e.g., magnetic particles, magnetic powders, etc.) can be at least partially covered with a layer, the layer including an antioxidant material. The layer can act as a corrosion-protective layer. The magnetic material at least partially covered with a layer can be incorporated into the polymer material.

In at least one aspect, the coating composition can include a polymer material and a coated, or partially coated, magnetic material comprising a magnetic material and an antioxidant material. The coated, or at least partially coated, magnetic material can be incorporated into the polymer material.

In at least one aspect, the polymer material can include an electrically-conductive polymer. The polymer material can serve to enhance electromagnetic energy absorption of the coating composition. The polymer material can also serve to lighten the composition by reducing the amount of magnetic material in the coating composition. In at least one aspect, the polymer material can include a polyaniline, a polypyrrole, a polyacetylene, a polythiophene, or a combination thereof.

In at least one aspect, the coating composition can further include an acid, such as dinonylnaphthalene sulfonic acid (DNNSA), dodecylbenzene sulfonic acid, camphorsulfonic acid, dibutylnaphthalene sulfonic acid, polystyrene sulfonic acid, or a combination thereof. The acid can serve to solubilize the conductive polymer and/or to render it conductive.

The magnetic material can serve to enhance electromagnetic absorption properties of the coating composition. In at least one aspect, the magnetic material can include iron (such as carbonyl iron), an iron alloy, nickel, a nickel alloy, cobalt, a cobalt alloy, an iron oxide, a hexagonal ferrite, or a combination thereof. The hexagonal ferrite can include barium, strontium, manganese, nickel, zinc, cobalt, or a combination thereof. In at least one aspect, the hexagonal ferrite can include barium ferrite (e.g., $BaFe_{12}O_{19}$), strontium ferrite ($SrFe_{12}O_{19}$), manganese-zinc ferrite (having the formula $Mn_xZn_{(1-x)}Fe_2O_4$), nickel zinc ferrite (having the formula $Ni_xZn_{(1-x)}Fe_2O_4$), cobalt ferrite (having the formula $CoFe_2O_4$), or a combination thereof. Other examples of the magnetic material can include $Fe_2O_3$, $Fe_3O_4$, FeSi, or a combination thereof.

The antioxidant material can serve to protect the magnetic material from environmental oxidation and corrosion, as well as the acidity of the polymer material. In at least one aspect, the antioxidant material can include organic compounds that contain heteroatoms (such as N, S, P, O, or a combination thereof) and/or multiple bonds, and/or in addition to some functional groups. In at least one aspect, the antioxidant material can include organic compounds having one or more functional groups selected from the group consisting of —OH, —COOH, —NH$_2$, and the like. These antioxidant materials, and others, can display excellent antioxidant characteristics, especially in aqueous media.

In at least one aspect, the antioxidant material can include an oxide, a phosphate, a fatty acid, a salt of a fatty acid, a saccharide, a polysaccharide, a sulfur-containing group, a molecule containing one or more oxygen functionalities, an antioxidant polymer, or a combination thereof. Non-limiting examples of oxides can include metal oxides, such as cerium oxide, aluminum oxide, chromium oxide, silicon oxide, yttrium oxide, iron oxide, titanium oxide, or a combination thereof. Non-limiting examples of phosphates can include metal phosphates such as iron phosphate. Non-limiting examples of fatty acids can include oleic acid, and non-limiting examples of the salt of a fatty acid can include sodium oleate. Non-limiting examples of saccharides can include glucose, ribose, fructose, or a combination thereof. Non-limiting examples of polysaccharides can include those polysaccharides composed of monomers such as glucose, ribose, fructose, or a combination thereof. Another non-limiting example of a polysaccharide can be starch. Non-limiting examples of a sulfur-containing group can include a thiol (e.g., an organic thiol), such as 2,5-dimercapto-1,3, 4-thiadiazole, 1-octadecanethiol, 12-thioldodecanoic acid, or a combination thereof. The sulfur-containing group, e.g., thioldodecanoic acid, can form an organized molecular assembly that aids in corrosion resistance. Non-limiting examples of the molecule containing one or more oxygen functionalities can include graphene oxide. Non-limiting examples of the antioxidant polymer can include those formed from ethylene glycol, such as methoxypoly(ethylene glycol) (MPEG), aromatic carboxylic acids, and a combination thereof.

Optionally, the coating composition can include one or more dopants such as a secondary dopant. A secondary dopant is a substance which when added or applied in the form of a liquid and/or vapor to polyaniline already doped (protonated) by a primary dopant, induces changes in molecular conformation that enhances electrical conductivity. The dopants can serve to enhance absorption of electromagnetic energy of the coating composition. Dopants can be selected based on, e.g., their stability and/or interaction with one or more components of the coating composition and/or substrate. Non-limiting examples of secondary dopants can include sulfonyl diphenol (SDP), p-toluenesulfonic acid (p-TSA), m-cresol, 2-(2-hydroxyphenyl)benzene-1,4-diol, 2-(2-hydroxyethyl)benzene-1,4-diol, 3-ethylphenol, 1-dodecanesulfonic acid, d-camphorsulfonic acid, 2-dodecylbenzenesulfonic acid, 1-anthrol, 2-chlorophenol, benzenesulfonic acid, 2-naphthol, 2-fluorophenol, 3-isopropylphenol, 2-methylbenzenesulfonic acid, phenyl dodecane-1-sulfonate, and a combination thereof.

Dopants can be added to the coating composition before curing the coating composition. Dopants can be added neat or in a solution to the coating composition. For example, SDP can be added neat to a mixture that includes a passivated magnetic material, a polymer material, and a solvent (e.g., cymene).

Additionally, or alternatively, secondary dopants can be added to a coated substrate at a time point between a first cure and a second cure as described below. Secondary dopants can be added neat or in a solution to the coated substrate. In an example, p-TSA can be added to a coated substrate (e.g., a coated substrate that has been cured) by introducing the coated substrate to a solution of p-TSA in a solvent to form a second coated substrate. The second coated substrate can then be cured.

In at least one aspect, the coating composition can have one or more of the following characteristics:

1) A mol ratio of the moles of acid to the moles of monomer in the polymer material that is from about 0.1:1 to about 10:1, such as from about 0.2:1 to about 5:1, such as from about 0.5:1 to about 2:1, such as about 0.75:1, about 1:1, or about 1.5:1. As an example, the moles of monomer in the polymer material can be the moles of aniline in the polyaniline.

2) A total amount of polymer material plus the acid (e.g., DNNSA), based on a total weight of a coating composition, that is from about 40 wt % to about 99 wt %, such as from about 45 wt % to about 95 wt %, such as from about 50 wt % to about 90 wt %, such as from about 55 wt % to about 85 wt %, such as from about 60 wt % to about 80 wt %, such as from about 65 wt % to about 75 wt %. The amount of polymer material plus acid can be based on the conductivity desired. The amount of polymer material plus acid can also serve to lighten the composition by reducing the amount of magnetic material in the coating composition.

3) An amount of magnetic material, based on a total weight of a coating composition, that is from about 1 wt % to about 60 wt %, such as from about 5 wt % to about 50 wt %, such as from about 10 wt % to about 45 wt %, such as from about 15 wt % to about 45 wt %, such as from about 20 wt % to about 40 wt %, such as from about 25 wt % to about 35 wt %. The magnetic material can serve to enhance electromagnetic absorption properties of the coating composition.

4) An amount of antioxidant material, based on a total weight of a coating composition, that is from about 0.1 wt % to about 2 wt %, such as from about 0.15 wt % to about 1.5 wt %, such as from about 0.2 wt % to about 1 wt %, such as from about 0.25 wt % to about 0.75 wt %, such as from about 0.3 wt % to about 0.5 wt %. The amount of antioxidant can be based on the acidity of the polymer material and the oxidative conditions the coating composition may undergo.

5) An amount of a dopant (e.g., sulfonyl diphenol, p-TSA, etc.), based on a total weight of the coating composition, that is from about 1 wt % to about 80 wt %, such as from about 10 wt % to about 60 wt %, such as from about 35 wt % to about 55 wt %. The amount of dopant can be based on the amount of enhanced adsorption desired, but can be limited by their stability with one or more components of the coating composition and/or substrate.

In at least one aspect, the coating composition can have a resistance that is greater than about 100 ohm ($\Omega$), such as from about 100$\Omega$ to about 100 mega-ohm (Me), such as from about 1 M$\Omega$ to about 90 M$\Omega$, such as from about 10 M$\Omega$ to about 80 M$\Omega$, such as from about 20 M$\Omega$ to about 70 M$\Omega$, such as from about 30 M$\Omega$ to about 60 M$\Omega$, such as from about 40 M$\Omega$ to about 50 Ma. In at least one aspect, the coating composition can have a resistance that is less than about 1 Ma, such as less than about 500,000$\Omega$, such as less than about 15,000$\Omega$, such as less than about 1,500$\Omega$, such as from about 1$\Omega$ to about 1,000$\Omega$, such as from about 10$\Omega$ to about 250$\Omega$, such as from about 20$\Omega$ to about 200$\Omega$, such as from about 30$\Omega$ to about 100$\Omega$.

In at least one aspect, the coating compositions can be used to coat a substrate as described below.

Forming the Coating Compositions

The present disclosure also provides methods for forming a coating composition. As stated above, the coating composition can include a magnetic material, a polymer material, and an antioxidant material. The coating compositions can optionally include an acid and/or one or more dopants.

Figure 1A:
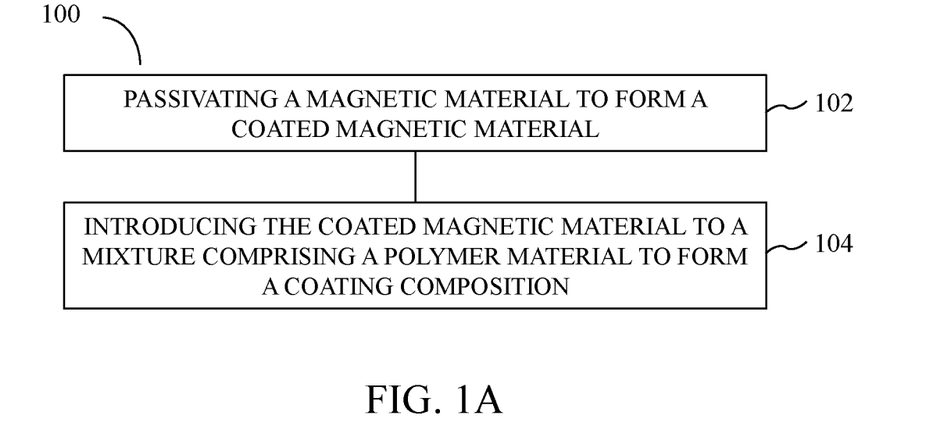
FIG. 1A is a flow chart illustrating a method of making a coating composition according to at least one aspect of the present disclosure.

FIG. 1A is a flow chart illustrating a method 100 of making a coating composition according to at least one aspect. The method 100 can include passivating a magnetic material at operation 102 to form a coated (or at least partially coated) magnetic material. Operation 102 is described below according to at least one aspect. The method 100 can further include introducing at least a portion of the coated (or at least partially coated) magnetic material (the passivated magnetic material) to a mixture comprising a polymer material to form a coating composition at operation 104. The mixture can optionally include an acid and/or a solvent in addition to the polymer material. The coating composition can be used for enhanced radar absorption. The polymer material can include those polymers described above such as polyaniline. The acid can be those acids described above that serve to solubilize the conductive polymer and/or to render it conductive such as dinonylnaphthalene sulfonic acid. In at least one aspect, the solvent for operation 104 can be an organic solvent, such as a hydrocarbon solvent, such as toluene, xylene, p-cymene, limonene, and/or a combination thereof. Solvents can be deaerated to remove air and moisture from the solvent by, e.g., (1) introducing 3 Å or 4 Å molecular sieves to the solvent and heating the solvent and/or (2) by bubbling inert gas (such as nitrogen or argon) through the solvent for a period of time of from about 10 minutes to about 72 hours, such as about 1 hour to about 24 hours.

Operation 104 can include stirring and/or mixing (mechanical and/or ultrasonic) the coated magnetic material with the mixture comprising a polymer material with any suitable stirring device, such as a stir bar or stir propeller or Vortex stirrer. Stirring, mixing, and/or roller milling can be performed for a period of time sufficient to passivate the magnetic material.

Heating can be performed before and/or during introducing the coated magnetic material to the mixture comprising a polymer material. In at least one aspect, a method can include heating to a temperature of from about 10° C. to about 120° C., such as from about 40° C. to about 80° C., such as about 60° C. In at least one aspect, the temperature can be from about 10° C. to about 80° C., such as from about 20° C. to about 50° C. In at least one aspect, stirring/mixing can be performed at a stir rate/vibration rate of from about 50 revolutions per minute (rpm) to about 5,000 rpm, such as from about 300 rpm to about 2,000 rpm. In at least one aspect, stirring/mixing can be performed for a time period of from about 10 seconds to about 1 hour, such as from about 30 seconds to about 5 minutes.

Figure 1B:
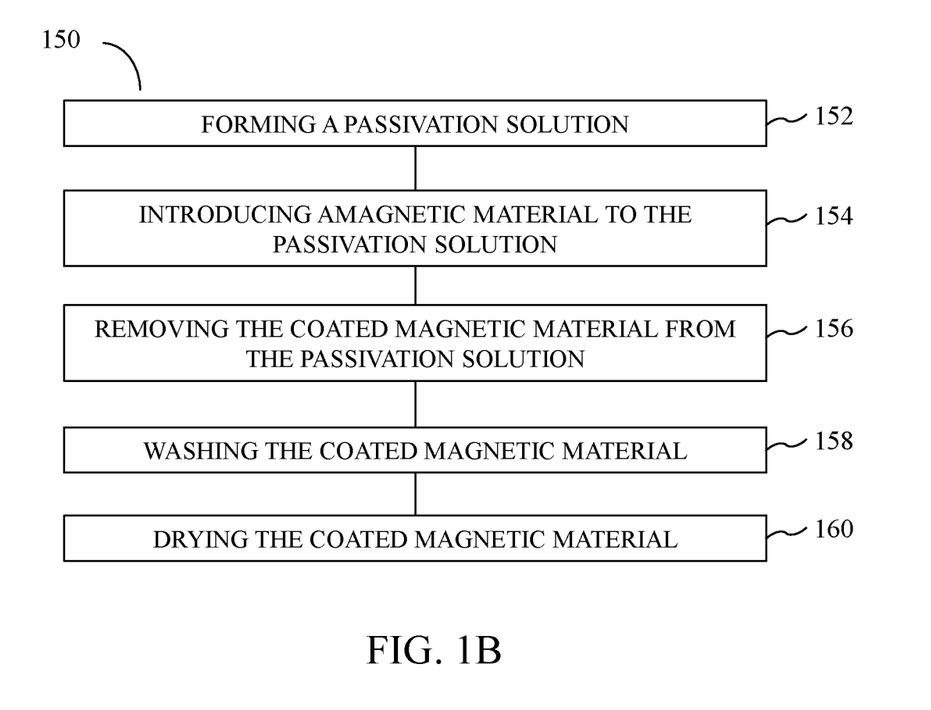
FIG. 1B is a flow chart illustrating a method of passivating a magnetic material according to at least one aspect of the present disclosure.

FIG. 1B is a method 150 for forming the coated (or at least partially coated) magnetic material by passivating the magnetic material with a passivation agent according to at least one aspect. The passivating agent can be an antioxidant. In at least one aspect, method 150 can be operation 102. The method 150 can include forming a passivation solution by dissolving or dispersing a passivation agent (e.g., an antioxidant) in a solvent at operation 152. Solvents can include one or more of an aqueous solvent (e.g., water, distilled water, deionized water, and ultra pure water) and/or an organic solvent that can sufficiently solubilize the antioxidant material and one or more substances that enables the antioxidant to passivate the magnetic material. Organic solvents can include alcohols, alkylcarbonates (e.g., dimethyl carbonate, diethyl carbonate, or dipropyl carbonate), ketones (e.g., acetone), hydrocarbons (e.g., toluene), ether (e.g., dimethyl ether or dipropylene glycol dimethyl ether), glycol ether, tetrahydrofuran (THF), N-methyl-2-pyrrolidone (NMP), dimethyl sulfoxide (DMSO), or a combination thereof. In at least one aspect, an alcohol solvent can include ethanol, n-propanol, isopropanol, n-butanol, isobutanol, sec-butanol, an amyl alcohol (such as n-pentanol, isopentanol, and sec-pentanol), or a combination thereof. In at least one aspect, the solvent can include one or more of water, peroxide (such as hydrogen peroxide), or an acid (such as hydrochloric acid). Solvents can be deaerated to remove air and moisture from the solvent by, e.g., (1) introducing 3 Å or 4 Å molecular sieves to the solvent and heating the solvent and/or (2) by bubbling inert gas (such as nitrogen or argon) through the solvent for a period of time of from about 10 minutes to about 72 hours, such as about 1 hour to about 24 hours.

In at least one aspect, a concentration (moles per liter) of passivation agent in the passivation solution can be from about 0.01 moles per liter (M) to about 10 M, such as from about 0.5 M to about 5 M, such as from about 1 M to about 2 M.

The method 150 can include introducing magnetic material (such as iron particles, such as carbonyl iron powder) to the passivation solution at operation 154 to form magnetic material fully or partially coated (e.g., encapsulated) in passivation agent. Alternatively, operation 154 can include introducing magnetic material to the solvent to form a magnetic material solution followed by introducing the passivation agent to the magnetic material solution to form magnetic material fully or partially coated (e.g., encapsulated) in passivation agent. Introducing (operation 154) can include stirring and/or mixing (mechanical and/or ultrasonic) the magnetic material in the passivation solution or magnetic material solution with any suitable stirring device, such as a stir bar or stir propeller or Vortex stirrer. Stirring can be performed in a Roller Mixer to provide a gentle mixing environment. Stirring, mixing, and or roller milling the magnetic material in the passivation solution can be performed for a period of time sufficient to passivate the magnetic material.

In at least one aspect, a weight ratio (g/g) of passivation agent to magnetic material can be from about 0.01:1 to about 1:0.01, such as from about 0.05:1 to about 0.5:1, such as from about 0.1:1 to about 0.4:1, such as about 0.11:1.

Before and/or during introducing the magnetic material to the passivation solution, the passivation solution or magnetic material solution can be heated. In at least one aspect, a method can include heating the passivation solution to a temperature of from about 20° C. to about 120° C., such as from about 40° C. to about 80° C., such as about 60° C. In at least one aspect, the temperature can be from about 10° C. to about 80° C., such as from about 20° C. to about 50° C. In at least one aspect, a method can include heating the magnetic material solution to a temperature of from about 20° C. to about 120° C., such as from about 40° C. to about 80° C., such as about 60° C.

In at least one aspect, stirring/mixing can be performed at a stir rate/vibration rate of from about 50 revolutions per minute (rpm) to about 5,000 rpm, such as from about 300 rpm to about 2,000 rpm. In at least one aspect, stirring/mixing can be performed for a time period of from about 10 seconds to about 1 hour, such as from about 30 seconds to about 5 minutes.

The method 150 can further include operations known to those of skill in the art for solvent removal and purification, such as vacuum filtration, washing with water, and air drying (at temperatures, e.g., above room temperature, such as about 70° C.). These are described in operations 156-160.

The method 150 can include removing the coated magnetic material from the passivation solution at operation 156. Removing can be performed using any suitable filtration setup, such as filter paper or wire gauze filter. In at least one aspect, a method can include filtering the coated magnetic material. Filter paper or wire gauze can have an average pore size of 100 microns or less, such as from about 0.1 micron to about 50 microns, such as from about 3 microns to about 20 microns, such as about 11 microns (Grade 1). Added or reduced pressure (e.g., vacuum) can be applied to the filtration setup to promote filtration of the coated magnetic material as the filtrand and solvent as the filtrate. The method 150 can further include washing the filtered coated material with a solvent at operation 158. In at least one aspect, the solvent can be one or more of those solvents used to form a passivating agent. Examples of solvent include an alcohol (e.g., isopropanol, ethanol, or methanol), an alkane (e.g., hexanes or toluene), an alkylcarbonate (e.g., dimethyl carbonate, diethyl carbonate, or dipropyl carbonate), ketones (e.g., acetone), or a combination thereof.

Method 150 can include drying the coated magnetic material at operation 160. Drying can be performed using a filter cloth, towel, and/or by pressurized air/inert gas. Inert gas includes nitrogen and/or argon. Drying can alternatively or additionally be performed by curing the coated magnetic material at room temperature or elevated temperature. In at least one aspect, a method can include drying the coated magnetic material by curing the material at a temperature of from about 10° C. to about 150° C., such as from about 20° C. to about 100° C., such as from about 30° C. to about 70° C., such as from about 40° C. to about 50° C. Curing can be performed for a time period of from about 15 minutes to about 72 hours. The coating can keep the magnetic material from corroding. This can be measured by exposing the coated magnetic material to a neutral salt fog (ASTM B 117) environment for about 1 day to about 2 days and watched for rust. Little or no rust can indicate a good coating.

Figure 2:
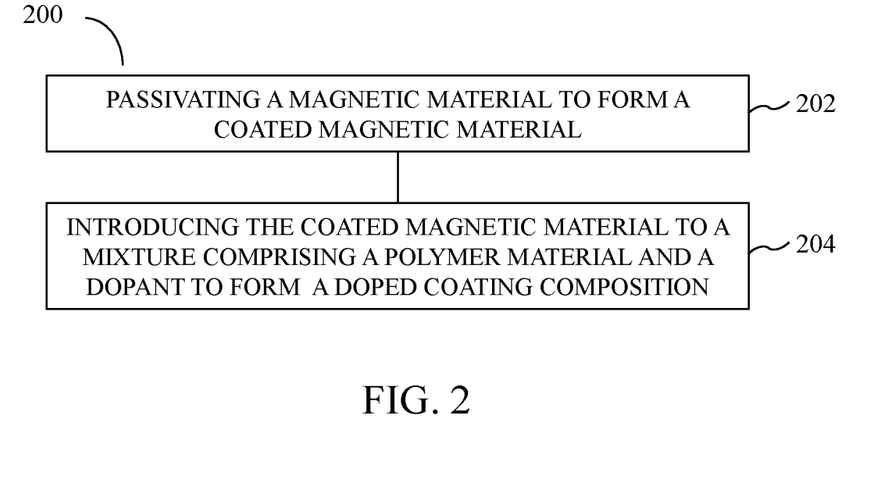
FIG. 2 is a flow chart illustrating a method of making a coating composition according to at least one aspect of the present disclosure.

FIG. 2 is a flow chart illustrating a method 200 of making a doped coating composition, according to at least one aspect. The method 200 of forming a doped coating composition can include passivating a magnetic material to form a coated (or at least partially coated) magnetic material at operation 202. Operation 202 can be performed according to methods and using materials provided above. The method can further include introducing at least a portion of the coated (or at least partially coated) magnetic material (the passivated magnetic material) to a mixture comprising a polymer material and a dopant to form a doped coating composition at operation 204. Operation 204 can be performed according to methods and using materials described above for operation 104 except that a dopant is additionally added to the mixture. The doped coating composition can be used for enhanced radar absorption.

Coated Substrates

The present disclosure also provides coated substrates. In at least one aspect, the coating compositions described herein can at least partially coat a substrate, forming a coated substrate. The substrate can be made from any suitable material and/or can include any suitable structure that can benefit from enhanced electromagnetic energy absorption. As illustrative, non-exclusive examples, the substrate can be made from and/or include a metal and/or a metal alloy. Examples of metals and metal alloys include aluminum, aluminum alloy, copper, copper alloy, iron, iron alloy, steel, steel alloy, titanium, titanium alloy, magnesium, magnesium alloy, or a combination thereof.

In at least one aspect, the substrate can define, and/or can be a portion of, one or more structural components of an apparatus, such as an aircraft, a watercraft, a spacecraft, a land vehicle, a satellite, equipment, consumer electronics (such as antennas, car radios, mobile phones, and telecommunications base stations), a wind turbine, and/or any apparatus that can benefit from enhanced radar absorption. The coating composition can be applied to a portion of a substrate such as a vehicle, such as a structural component of a vehicle, such as landing gear(s), a panel, and/or joint, of an aircraft. Examples of a structural component include an airfoil (such as a rotor blade), an auxiliary power unit, a nose of an aircraft, a fuel tank, a tail cone, a panel, a coated lap joint between two or more panels, a wing-to-fuselage assembly, a structural aircraft composite, a fuselage body-joint, a wing rib-to-skin joint, and/or other internal component.

Figure 3:
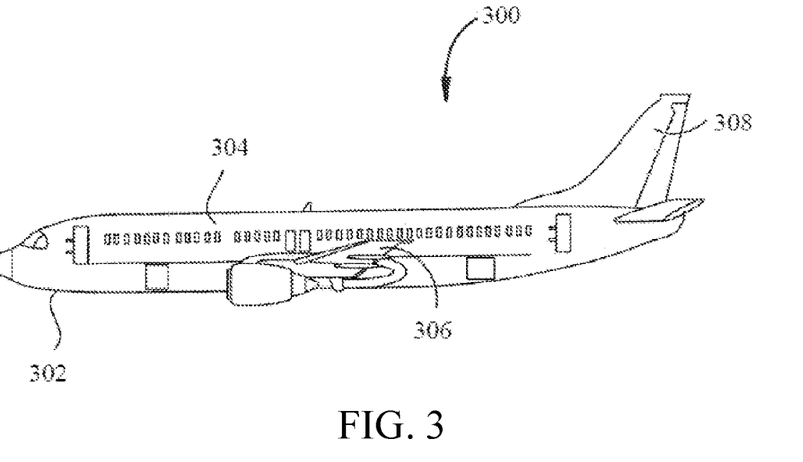
FIG. 3 is an aircraft comprising structural components, according to at least one aspect of the present disclosure.

FIG. 3 is an aircraft comprising vehicle components, according to at least one aspect of the present disclosure. As shown in FIG. 3, aircraft 300 includes an aircraft structure 302 including structural components, such as an elongated body 304, a wing 306 extending laterally from the body 304, and a tail 308 extending longitudinally from the body 304. The compositions of the present disclosure can be disposed on, e.g., one or more surfaces of the structural components and can form a substrate having enhanced radar absorptive properties.

In at least one aspect, the coating compositions can be applied to the substrate and then cured on the substrate, resulting in coated substrate that includes a permanent, or semi-permanent, coating of a cured composition on the substrate. In at least one aspect, the substrate can be pre-treated before application of the coating composition. The coating compositions (and/or cured coating compositions) can be a solid, a powder, a gel, a sol-gel, a liquid, or a liquefiable composition at room temperature (e.g., from about 15° C. to about 25° C.).

In at least one aspect, the coating composition can be applied alone, or can be formulated as a coating material and then applied, to at least partially coat, encapsulate, or cover a substrate. The coating composition can be formulated as a chemical conversion coating, a pretreatment, a sealant, a paint, a gel, a thin film, or a resin. The coating compositions can optionally include a pigment, a binder, a surfactant, an organic particle, a diluent, and/or a solvent, and other formulation additives.

In at least one aspect, the coating compositions and/or coating materials optionally can be applied to at least a portion of a substrate by, e.g., painting, spraying, electro-spraying, electro-coating, powder coating, fusion bonding, and/or immersing at least a portion of the substrate with and/or within a coating composition or coating material.

In at least one aspect, the coating compositions and/or coating materials can be cured, resulting in a cured composition and/or cured material (which, collectively, also can be referred to herein as cured coatings). Curing can include solvent evaporation, application of heat, light, electrical potential, and/or a chemical reactant. Curing can also include a chemical reaction, polymerization, cross-linking, and/or generally any method that results in a stable coating.

In at least one aspect, the cured coatings can take the form of a layer, a conformal coating, a film, a membrane, and/or a biofilm on the substrate. In at least one aspect, the coated substrates can be chemically resistant, abrasion resistant, germicidal, and/or ice repellant.

Forming the Coated Substrate

The present disclosure also provides methods for forming a coated substrate. As discussed above, the coating compositions include a magnetic material, a polymer material, and an antioxidant material. The coating compositions can optionally include an acid and/or one or more dopants.

Figure 4:
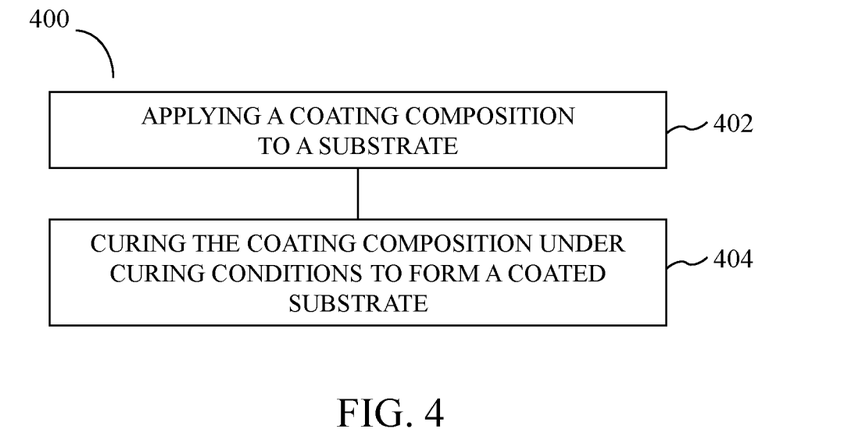
FIG. 4 is a flow chart illustrating a method of making a coated substrate according to at least one aspect of the present disclosure.

FIG. 4 is a flow chart illustrating a method 400 of making a coated substrate according to at least one aspect. The method 400 can include applying a coating composition described herein to a substrate at operation 402. The method 400 can further include curing the coating composition under curing conditions to form a coated substrate at operation 404. Methods of applying the coating composition and curing the coating composition are described above. Non-limiting examples of substrates include those substrates described above.

In at least one aspect, the curing conditions can include curing at a temperature of from about 10° C. to about 150° C., such as from about 20° C. to about 100° C., such as from about 30° C. to about 70° C., such as from about 40° C. to about 50° C.; curing under vacuum, nitrogen, or air; and/or curing for a time period of from about 10 minutes to about 24 hours. The cured composition may comprise one or more layers having a thickness of from about 0.5 mil to about 500 mil, such as from about 5 mil to about 100 mil, such as from about 10 mil to about 50 mil.

Figure 5:
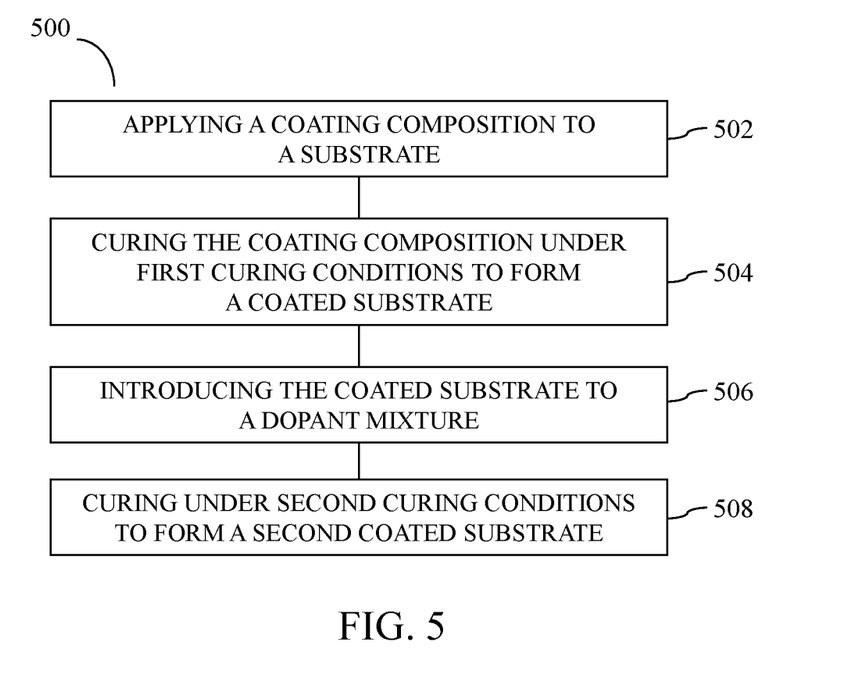
FIG. 5 is a flow chart illustrating a method of making a coated substrate according to at least one aspect of the present disclosure.

FIG. 5 is a flow chart illustrating a method 500 of making a coated substrate according to at least one aspect. The method 500 can include applying a coating composition described herein to a substrate at operation 502. The method 500 can further include curing the coating composition under first curing conditions to form a coated substrate at operation 504. Methods of applying the coating composition and curing the coating composition are described above. Non-limiting examples of substrates can include those substrates described above. The method 500 can include introducing the coated substrate to a mixture comprising a dopant (e.g., those dopants provided above, such as p-toluenesulfonic acid) and optionally a solvent (e.g., an organic solvent such as an alcoholic solvent, such as n-butanol) at operation 506. The coated substrate can be introduced to the mixture comprising a dopant by methods known in the art such as dipping, immersing, spraying, and other methods such as those listed for applying the coating composition. The concentration of dopant in the mixture comprising a dopant in operation 506 can be from about 0.01 M to about 1M, such as from about 0.1 M to about 0.5 M, such as from about 0.2 M to about 0.4 M. Method 500 can further include curing the under second curing conditions 508 to form a second coated substrate.

The first curing, the second curing, or a combination thereof, can include one or more of the following parameters. Performing the curing at a temperature of from about 10° C. to about 150° C., such as from about 20° C. to about 100° C., such as from about 30° C. to about 70° C., such as from about 40° C. to about 50° C.; performing the curing under vacuum, nitrogen, or air; and/or performing the curing for a time period of from about 10 minutes to about 24 hours. The cured composition may comprise one or more layers having a thickness of from about 0.5 mil to about 500 mil, such as from about 5 mil to about 100 mil, such as from about 10 mil to about 50 mil.

Aspects Listing

The present disclosure provides, among others, the following aspects, each of which may be considered as optionally including any alternate aspects.

Clause A1. A coating composition, comprising:
a polymer material; and
a coated or partially coated magnetic material (e.g., magnetic particles, magnetic powders, etc.) comprising a magnetic material and an antioxidant material.

Clause A2. A coating composition, comprising:
a polymer material; and
a magnetic material at least partially covered with a layer, the layer comprising an antioxidant material.

Clause A3. The coating composition of A2, wherein the layer is a corrosion protective layer.

Clause A4. The coating composition of any one of Clauses A1 to A3, wherein the polymer material includes an electrically conductive polymer.

Clause A5. The coating composition of any one of Clauses A1 to A4, wherein the antioxidant material comprises an oxide, a phosphate, a fatty acid, a salt of a fatty acid, a saccharide, a polysaccharide, a sulfur-containing group, a molecule containing one or more oxygen functionalities, an antioxidant polymer, or a combination thereof.

Clause A6. The coating composition of Clause A5, wherein the oxide comprises a metal oxide.

Clause A7. The coating composition of Clause A5 or Clause A6, wherein the oxide comprises cerium oxide, aluminum oxide, chromium oxide, silicon oxide, yttrium oxide, iron oxide, titanium oxide, or a combination thereof.

Clause A8. The coating composition of any one of Clauses A5 to A7, wherein the phosphate comprises a metal phosphate.

Clause A9. The coating composition of any one of Clauses A5 to A8, wherein the phosphate comprises iron phosphate.

Clause A10. The coating composition of any one of Clauses A5 to A9, wherein the fatty acid comprises oleic acid.

Clause A11. The coating composition of any one of Clauses A5 to A10, wherein the salt of the fatty acid comprises sodium oleate.

Clause A12. The coating composition of any one of Clauses A5 to A11, wherein the saccharide is glucose, ribose, or fructose.

Clause A13. The coating composition of any one of Clauses A5 to A12, wherein the polysaccharide comprises glucose, ribose, fructose, or a combination thereof.

Clause A14. The coating composition of any one of Clauses A5 to A13, wherein the polysaccharide is starch.

Clause A15. The coating composition of any one of Clauses A5 to A14, wherein the sulfur-containing group is a thiol, such as an organic thiol, such as 2,5-dimercapto-1,3,4-thiadiazole, 1-octadecanethiol, 12-thioldodecanoic acid, or a combination thereof.

Clause A16. The coating composition of any one of Clauses A5 to A15, wherein the molecule containing one or more oxygen functionalities is graphene oxide.

Clause A17. The coating composition of any one of Clauses A5 to A16, wherein the antioxidant polymer includes an ethylene glycol.

Clause A18. The coating composition of any one of Clauses A5 to A17, wherein the antioxidant polymer includes methoxypoly(ethylene glycol) (MPEG).

Clause A19. The coating composition of any one of Clauses A1 to A4, wherein the antioxidant material comprises organic compounds that contain heteroatoms such as N, S, P, O, or a combination thereof.

Clause A20. The coating composition of any one of Clauses A1 to A4, wherein the antioxidant material comprises an organic compound having a functional group selected from the group consisting of —OH, —COOH, —NH$_2$, and the like, and a combination thereof.

Clause A21. The coating composition of any one of Clauses A1 to A20, wherein the coated (or partially coated) magnetic material is at least partially incorporated into a polymer material.

Clause A22. The coating composition of any one of Clauses A1 to A21, further comprising an acid.

Clause A23. The coating composition of Clause A22, wherein the acid comprises dinonylnaphthalene sulfonic acid.

Clause A24. The coating composition of Clause A22 or Clause A23, wherein a mol ratio of the moles of acid to the moles of monomer in the polymer material is from about 1:5 to about 5:1.

Clause A25. The coating composition of Clause A24, wherein the mol ratio of the moles of acid to the moles of monomer in the polymer material is from about 2:1 to about 0.5:1, such as about 1.5:1, about 1:1, or about 0.75:1.

Clause A26. The coating composition of any one of Clauses A1 to A25, wherein the magnetic material comprises iron, an iron alloy, nickel, a nickel alloy, cobalt, a cobalt alloy, an iron oxide, a hexagonal ferrite, or a combination thereof.

Clause A27. The coating composition of Clause A26, wherein the hexagonal ferrite includes, barium, strontium, manganese, nickel, zinc, cobalt, or a combination thereof.

Clause A28. The coating composition of Clause A26, wherein the hexagonal ferrite includes barium ferrite (e.g., $BaFe_{12}O_{19}$), strontium ferrite ($SrFe_{12}O_{19}$), manganese-zinc ferrite (having the formula $Mn_xZn_{(1-x)}Fe_2O_4$), nickel zinc ferrite (having the formula $Ni_xZn_{(1-x)}Fe_2O_4$), cobalt ferrite (having the formula $CoFe_2O_4$), or a combination thereof.

Clause A29. The coating composition of any one of Clauses A1 to A25, wherein the magnetic material comprises carbonyl iron.

Clause A30. The coating composition of any one of Clauses A1 to A29, wherein the polymer material includes a polyaniline, a polypyrrole, a polyacetylene, a polythiophene, or a combination thereof.

Clause A31. The coating composition of any one of Clauses A1 to A30, wherein the magnetic material comprises $Fe_2O_3$, $Fe_3O_4$, FeSi, or a combination thereof.

Clause A32. The coating composition of any one of Clauses A1 to A31, wherein the coating composition comprises a total amount of polymer material and acid in the coating composition that is from about 40 wt % to about 99 wt % based on a total weight of the coating composition.

Clause A33. The coating composition of any one of Clauses A1 to A32, wherein the coating composition comprises an amount of magnetic material that is from about 1 wt % to about 60 wt % based on a total weight of the coating composition.

Clause A34. The coating composition of any one of Clauses A1 to A33, wherein the coating composition comprises an amount of antioxidant material that is from about 0.01 wt % to about 1 wt % based on a total weight of the coating composition.

Clause A35. The coating composition of any one of Clauses A1 to A34, wherein the coating composition has a resistance of from about 100 ohm ($\Omega$) to about 100 megaohm (M$\Omega$), Clause A36. The coating composition of any one of Clauses A1 to A35, wherein the coating composition has a resistance of from about 1 M$\Omega$ to about 50 M$\Omega$.

Clause A37. The coating composition of any one of Clauses A1 to A36, wherein the coating composition has a resistance of from about 20 M$\Omega$ to about 30 M$\Omega$.

Clause A38. The coating composition of any one of Clauses A1 to A37, wherein the coating composition has a resistance of from about 1$\Omega$ to about 1 M$\Omega$, such as from about 10$\Omega$ to about 100,000$\Omega$, such as from about 100$\Omega$ to about 10,000$\Omega$.

Clause A39. The coating composition of any one of Clauses A1 to A38, further comprising a dopant.

Clause A40. The coating composition of Clause A39, wherein the coating composition comprises an amount of dopant that is from about 1 wt % to about 80 wt %, such as from about 10 wt % to about 60 wt %, such as from about 35 wt % to about 55 wt % based on a total weight of the coating composition.

Clause A41. The coating composition of Clause A39 or Clause A40, wherein the dopant comprises sulfonyl diphenol (SDP), p-toluenesulfonic acid (p-TSA), m-cresol, 2-(2-hydroxyphenyl)benzene-1,4-diol, 2-(2-hydroxyethyl)benzene-1,4-diol, 3-ethylphenol, 1-dodecanesulfonic acid, d-camphorsulfonic acid, 2-dodecylbenzenesulfonic acid, 1-anthrol, 2-chlorophenol, benzenesulfonic acid, 2-naphthol, 2-fluorophenol, 3-isopropylphenol, 2-methylbenzenesulfonic acid, phenyl dodecane-1-sulfonate, and a combination thereof.

Clause A42. The coating composition of any one of Clauses A1 to A41 having a resistance less than 1 M$\Omega$.

Clause B1. A method of making a coating composition, comprising:
introducing, under first conditions, a magnetic material to a passivation solution comprising an antioxidant to form a at least partially coated magnetic material; and
introducing, under second conditions, the at least partially coated magnetic material to a mixture comprising a polymer material to form a coating composition.

Clause B2. The method of Clause B1, wherein the at least partially coated magnetic material is a coated magnetic material.

Clause B3. The method of Clause B1 or Clause B2, wherein the coating composition includes the coating composition of any one of Clauses A1 to A42.

Clause B4. The method of any one of Clauses B1 to B3, wherein the first conditions comprise heating to a first temperature of from about 10° C. to about 80° C., such as from about 20° C. to about 50° C.

Clause B5. The method of any one of Clauses B1 to B4, wherein the first conditions further comprise mechanical mixing and/or ultrasonic mixing.

Clause B6. The method of any one of Clauses B1 to B5, wherein the mixture comprising a polymer material further comprises an acid, a solvent, or a combination thereof.

Clause B7. The method of any one of Clauses B1 to B6, wherein the second conditions comprise heating to a second temperature of from about 10° C. to about 80° C., such as from about 20° C. to about 50° C.

Clause B8. The method of any one of Clauses B1 to B7, wherein the second conditions further comprise mechanical mixing and/or ultrasonic mixing.

Clause B9. The method of any one of Clauses B1 to B8, wherein the solvent is selected from the group consisting of toluene, xylene, p-cymene, limonene, and a combination thereof.

Clause C1. A method of making a coating composition, comprising:
introducing, under first conditions, a magnetic material to a passivation solution comprising an antioxidant to form a at least partially coated magnetic material; and
introducing, under second conditions, the at least partially coated magnetic material to a mixture comprising a polymer material and a dopant to form a coating composition.

Clause C2. The method of Clause C1, wherein the at least partially coated magnetic material is a coated magnetic material.

Clause C3. The method of Clause C1 or Clause C2, wherein the coating composition includes the coating composition of any one of Clauses A1 to A42.

Clause C4. The method of any one of Clauses C1 to C3, wherein the first conditions comprise heating to a first temperature of from about 10° C. to about 80° C., such as from about 20° C. to about 50° C.

Clause C5. The method of any one of Clauses C1 to C4, wherein the first conditions further comprise mechanical mixing and/or ultrasonic mixing.

Clause C6. The method of any one of Clauses C1 to C5, wherein the mixture comprising a polymer material further comprises an acid, a solvent, or a combination thereof.

Clause C7. The method of any one of Clauses C1 to C6, wherein the second conditions comprise heating to a second temperature of from about 10° C. to about 80° C., such as from about 20° C. to about 50° C.

Clause C8. The method of any one of Clauses C1 to C7, wherein the second conditions further comprise mechanical mixing and/or ultrasonic mixing.

Clause C9. The method of any one of Clauses C1 to C8, wherein the solvent is selected from the group consisting of toluene, xylene, p-cymene, limonene, and a combination thereof.

Clause D1. A method of forming a coated substrate, comprising:
applying a coating composition of any one of Clauses A1 to A42 to a substrate; and
curing the coating composition under first curing conditions to form a coated substrate.

Clause D2. The method of Clause D1, further comprising introducing the coated substrate to a mixture comprising a dopant (e.g., p-toluenesulfonic acid) to form a second coated substrate (e.g., a doped, coated substrate).

Clause D3. The method of Clause D3, further comprising curing the second coated substrate under second curing conditions.

Clause D4. The method of any one of Clauses D1 to D3, wherein the substrate comprises aluminum, aluminum alloy, copper, copper alloy, iron, iron alloy, steel, steel alloy, titanium, titanium alloy, magnesium, magnesium alloy, or a combination thereof.

Clause D5. The method of any one of Clauses D1 to D4, wherein the substrate comprises a portion of a structural component of an aircraft, a watercraft, a spacecraft, a land vehicle, a satellite, a wind turbine, or equipment.

Clause D6. The method of Clauses D1 to D5, wherein the mixture comprising a dopant further comprises a solvent, such as an organic solvent, such as an alcoholic solvent, such as n-butanol Clause D6. The method of any one of Clauses D2 to D6, wherein a concentration of dopant in the mixture comprising a dopant is from about 0.01 M to about 1M, such as about 0.1 M to about 0.5 M, such as about 0.2 M to about 0.4 M.

Clause E1. A coated substrate, comprising: the coating composition of any one of Clauses A1 to A42 and a substrate.

Clause E2. The coated substrate of Clause E1, wherein the substrate comprises aluminum, aluminum alloy, copper, copper alloy, iron, iron alloy, steel, steel alloy, titanium, titanium alloy, magnesium, magnesium alloy, or a combination thereof.

Clause E3. The coated substrate of Clause E1 or Clause E2, wherein the substrate comprises a portion of a structural component of an aircraft, a watercraft, a spacecraft, a land vehicle, a satellite, a wind turbine, or equipment.

Clause F1. A coated substrate, comprising: a film comprising the coating composition of any one of Clauses A1 to A42 and a substrate.

Clause F2. The coated substrate of Clause F1, wherein the substrate comprises aluminum, aluminum alloy, copper, copper alloy, iron, iron alloy, steel, steel alloy, titanium, titanium alloy, magnesium, magnesium alloy, or a combination thereof.

Clause F3. The coated substrate of Clause F1 or Clause F2, wherein the substrate comprises a portion of a structural component of an aircraft, a watercraft, a spacecraft, a land vehicle, a satellite, a wind turbine, or equipment.

EXAMPLES

Cerium nitrate hexahydrate ($Ce(NO_3)_3 \cdot 6H_2O$) and hydrogen peroxide ($H_2O_2$) are commercially available from Sigma-Aldrich Co. Carbonyl iron particles can be purchased commercially from BASF Co. The average particle size of the carbonyl iron particles is from about 6.5 μm to about 8.5 μm (d50) without any surface coating. These particles can be considered as a soft magnetic material with high magnetic saturation value due to the chemical composition of the carbonyl iron particles (CIP), which contains at least about 99.5% Fe.

Resistance was measured according to the following procedure: The formulations were drop cast with an eye dropper to form a uniform film onto microscope slides and cured. Silver contacts were applied to the films as narrow bars separated by the width of the slide to form a square. Resistances were measured with Keithley Multimeter and recorded as ohms/square.

A. Coating of Carbonyl Iron Particles by Cerium Oxide

Cerium nitrate hexahydrate (about 1.2 g), 30% $H_2O_2$ (about 1.7 ml), and concentrated hydrochloric acid (about 0.25 mL) was dissolved in about 500 ml water yielding a yellow solution and mixed using a magnetic stirrer for about 30 min. The pH and temperature of the solution was fixed at about 3 and about 45° C., respectively. CIP (50 g) was then added to the solution and the mixture was roller milled for about 15 minutes. The particles can be separated from the solution using vacuum filtration using 11 cm filter paper. The resulting solid can be washed about four times with distilled water to separate the unreacted cerium compounds. Afterwards, the coated particles were dried in an oven at about 70° C. for about 72 h to provide the cerium oxide (CeO) encapsulated CIP (CeO-CIP). Alternatively, the particles can be separated from the solution using a centrifugal washing machine. This washing process by distilled water was repeated about three times to separate the unreacted cerium compounds. Afterwards, the coated particles were dried in an oven at about 90° C. for about 2 h to provide the CeO encapsulated CIP (CeO-CIP).

B. Preparation of a Conductive Polymer Film Containing the CeO-CIP

The CeO-CIP was dispersed in polyaniline (PANI)-dinonylnaphthalene sulfonic acid (DNNSA) (PANI-DNNSA) and a solvent (e.g., toluene and/or xylene) using a laboratory vortex mixer. The dispersion was mixed at about 22° C. for about 2 minutes. The resultant dispersion can be drop cast on glass microscope slides to produce films. As a control, films using CIP and PANI-DNNSA were also prepared. The films were allowed to air dry at about 22° C. for about 5 h. Table 1 provides example (Ex.) and comparative example (C. Ex.) formulations.

TABLE 1

| | Example and Comparative Formulations | | | | | |
|---|---|---|---|---|---|---|
| Sample | Ex. 1 | Ex. 2 | C. Ex. 1 | C. Ex. 2 | C. Ex. 3 | C. Ex. 4 |
| Particles | CeO-CIP | CeO-CIP | CIP | CIP | None | CIP |
| Polymer | PANI-DNNSA | PANI-DNNSA | PANI-DNNSA | PANI-DNNSA | PANI-DNNSA | Polyurethane |
| Wt. Particles (g) | 3.75 | 3.89 | 3.72 | 3.08 | None | — |
| mol ratio of DNNSA to aniline | 1.8:1 | 1.8:1 | 1.5:1 | 1.8:1 | 1.8:1 | — |
| Concentration of PANI-DNNSA in toluene (wt %) | 20.06 | 20.06 | 12.8 | 20.06 | 20.06 | — |
| CeO-CIP or CIP in PANI-DNNSA Film (wt %) | 78.1 | 79.1 | 84.5 | 74.6 | 0.0 | — |

The PANI-DNNSA CeO-CIP and CIP cast films had a smooth mat finish after air drying. Though the films were sticky, each example film had a resistance in the 20 MΩ to 30 MΩ range. In contrast, CIP-formulated polyurethane coatings exhibited infinite resistance and therefore little to no conductivity.

All resistance measurements were performed according to the following procedure. The formulations were drop cast with an eye dropper to form a uniform film onto 3"×1" microscope slides and cured. To make electrical contacts, Silver epoxy ink (Conductive compounds, Inc) was applied to the film with a small paint brush as narrow bars (⅛") separated by 1" (the width of the slide) to form a square. To cure the silver epoxy ink contacts, the specimen was dried at 70 C for 2 hours. Resistances in ohms between the silver contacts were measured with Keithley Multimeter and recorded as ohms/square.

C. Doping of the Conductive Polymers (CPs) Containing the CeO-CIP

Example C1. Process 1

52.3 wt % PANI-DNNSA (a molar ratio of DNNSA to aniline of about 1.5:1.0) in toluene was dissolved in cymene followed by addition of a CeO-CIP powder. The solution was mixed on a vortex mixer followed by drop casting onto glass microscope slides. Various concentrations of components and conditions are described in Table 2. The films were allowed to air dry for about 8 hours under ambient conditions followed by drying at about 150° C. for about 30-45 minutes. After drying, the resistances of the films were measured. The films were then dipped into a solution of p-toluenesulfonic acid (p-TSA) in n-butanol (1% to about 10% w/w) for about one minute, dried at about room temperature followed by drying again at about 150° C. for about 30-45 minutes. Resistances were measured again, and showing about a 5 to 6 order of magnitude increase in conductivity. Examples for Process 1 are shown in Table 2 as Examples 3-6.

Example C2. Process 2

A mixture of 52.3 wt % PANI-DNNSA (a molar ratio of DNNSA to aniline of about 1.5:1.0) in toluene was dissolved in cymene followed by addition of a CeO-CIP powder. An amount of sulfonyl diphenol (SDP) was then added to the mixture. The solution was mixed on a vortex mixer followed by drop casting onto microscope slides. Various concentrations of components and conditions are described in the table below. The films were allowed to air dry for about 8 hours under ambient conditions followed by drying at about 150° C. for about 30-45 minutes. After drying, the resistances of the films were measured, showing a marked drop in the resistance. The films were then dipped into a solution of p-TSA in n-butanol (1% to about 10% w/w) for about one minute, dried at room temperature followed by drying again at about 150° C. for about 30-45 minutes. Resistances were measured again, showing a further reduction in resistance and improvement in conductivity. Examples for Process 2 are shown in Table 2 as Examples 7-10.

Figure 6:
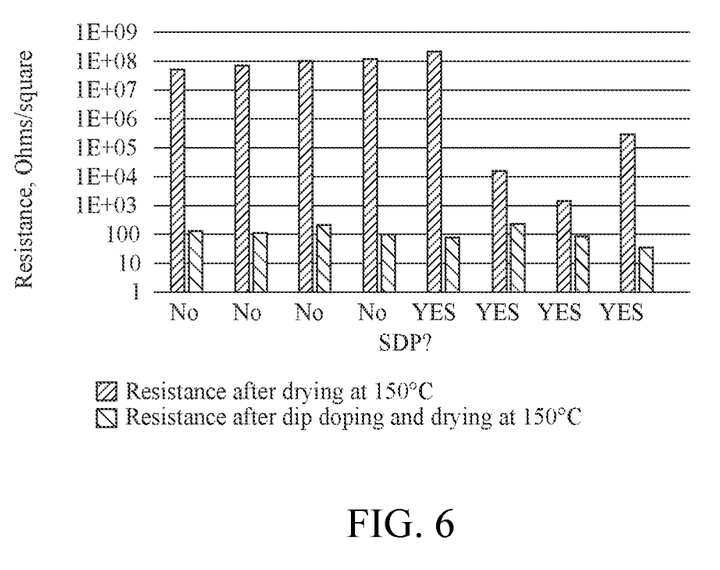
FIG. 6 is bar chart showing resistance values for example coating compositions according to at least one aspect of the present disclosure.

Table 2 and FIG. 6 shows that the coating compositions can have improved conductivity by the addition of one or more dopants. Examples 3-6 illustrate that a doping operation (dip-doping) after curing the coating composition on a substrate significantly improves the conductivity of the coated substrate. Examples 7-10 show that addition of the dopant (SDP) before curing significantly improves the conductivity of the coated substrate. Examples 7-10 also show that a doping operation (dip-doping) after curing can further improve the conductivity of the coated substrate. Also, the use of CeO-CIP in the coating composition increases the conductivity when incorporating SDP.

TABLE 2

Example Formulations

| | Ex. 3 | Ex. 4 | Ex. 5 | Ex. 6 | Ex. 7 | Ex. 8 | Ex. 9 | Ex. 10 |
|---|---|---|---|---|---|---|---|---|
| PANI-DNNSA, Initial Conc. in toluene, wt % | 52.36 | 52.36 | 52.36 | 52.36 | 52.36 | 52.36 | 52.36 | 52.36 |
| PANI-DNNSA (grams) | 0.791 | 1.032 | 1.056 | 1.455 | 0.791 | 1.032 | 1.056 | 1.455 |
| Conc. PANI-DNNSA in Cymene, wt % | 4.82 | 6.28 | 6.43 | 8.86 | 4.82 | 6.28 | 6.43 | 8.86 |
| Conc. CeO-CIP in Cymene, wt % | 0 | 2.34 | 1.41 | 3.44 | 0 | 2.34 | 1.41 | 3.44 |
| CeO-CIP in dry film, wt % | 0 | 27.11 | 17.95 | 27.98 | 0 | 15.66 | 9.04 | 15.73 |
| PANI in dry film, wt % | 100 | 72.89 | 82.04 | 72.01 | 47.59 | 42.10 | 41.29 | 40.51 |
| Weight (g) of solution before SDP added Solution before SDP | 0 | 0 | 0 | 0 | 8.99 | 9.26 | 9.33 | 9.96 |
| SDP in the mixture, wt % | 0 | 0 | 0 | 0 | 5.07 | 5.86 | 7.13 | 8.26 |
| SDP in dry film, wt % | 0 | 0 | 0 | 0 | 53.90 | 45.20 | 47.67 | 37.70 |
| Resistance after drying at 150° C. (MΩ) | 52.1 | 72.4 | 107 | 129 | 244 | 0.0142 | 1.39E−03 | 0.267 |
| Resistance after dip-doping and drying at 150° C. (MΩ) | 1.28E−03 | 1.12E−03 | 2.10E−03 | 9.87E−05 | 7.63E−05 | 2.51E−04 | 7.58E−05 | 3.27E−05 |

The non-limiting examples show that coating compositions containing a magnetic material (e.g., carbonyl iron) and a conductive polymer (polyaniline) can have enhanced conductivity. In addition, at least partial encapsulation of the magnetic material by the antioxidant material (e.g., cerium oxide) can provide corrosion resistance to the environment as well as the acidic conductive polymer. To address the corrosion resistance and density drawbacks of carbonyl iron based coatings, the carbonyl iron can be passivated with cerium oxide and can be incorporated into a conductive polymer matrix. Moreover, the use of dopants can further enhance the conductivity of the coating compositions. The coating compositions described herein can be added to a substrate that can benefit from enhanced electromagnetic absorption properties such as aircraft, watercraft, spacecraft, land vehicles, satellites, consumer electronics (such as antennas, car radios, mobile phones, and telecommunications base stations), and wind turbines.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

The phrases, unless otherwise specified, "consists essentially of" and "consisting essentially of" do not exclude the presence of other steps, elements, or materials, whether or not, specifically mentioned in this specification, so long as such steps, elements, or materials, do not affect the basic and novel characteristics of the present disclosure, additionally, they do not exclude impurities and variances normally associated with the elements and materials used.

All documents described herein are incorporated by reference herein, including any priority documents and/or testing procedures to the extent they are not inconsistent with this text. As is apparent from the foregoing general description and the specific aspects, while forms of this disclosure have been illustrated and described, various modifications can be made without departing from the spirit and scope of this disclosure. Accordingly, it is not intended that this disclosure be limited thereby. Likewise, the term "comprising" is considered synonymous with the term "including" for purposes of United States law. Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "is" preceding the recitation of the composition, element, or elements and vice versa.

What is claimed is:

1. A method of forming a coating composition, comprising:
    introducing, under first conditions, a magnetic material to a passivation solution comprising an antioxidant material to form an at least partially coated magnetic material, the antioxidant material selected from the group consisting of cerium oxide, aluminum oxide, chromium oxide, yttrium oxide, iron oxide, titanium oxide, and combinations thereof; and
    introducing, under second conditions, the at least partially coated magnetic material to a mixture comprising a polymer material to form a coating composition, wherein the mixture further comprises a dopant selected from the group consisting of sulfonyl diphenol (SDP), p-toluenesulfonic acid (p-TSA), m-cresol, 2-(2-hydroxyphenyl)benzene-1,4-diol, 2-(2-hydroxyethyl)benzene-1,4-diol, 3-ethylphenol, 1-dodecanesulfonic acid, d-camphorsulfonic acid, 2-dodecylbenzenesulfonic acid, 1-anthrol, 2-chlorophenol, benzenesulfonic acid, 2-naphthol, 2-fluorophenol, 3-isopropylphenol, 2-methylbenzenesulfonic acid, phenyl dodecane-1-sulfonate, and combinations thereof.

2. The method of claim 1, wherein the mixture comprising the polymer material further comprises an acid, a solvent, or combinations thereof.

3. The method of claim 2, wherein the acid is selected from the group consisting of dinonylnaphthalene sulfonic acid (DNNSA), dodecylbenzene sulfonic acid, camphorsulfonic acid, dibutylnaphthalene sulfonic acid, polystyrene sulfonic acid, and combinations thereof.

4. The method of claim 1, wherein the coating composition has a resistance less than 1 MΩ.

5. The method of claim 4, wherein the coating composition has a resistance of less than 1,500 Ω.

6. The method of claim 1, wherein the magnetic material comprises iron, an iron alloy, nickel, a nickel alloy, cobalt, a cobalt alloy, an iron oxide, a hexagonal ferrite, or combinations thereof.

7. The method of claim 6, wherein the hexagonal ferrite comprises barium ferrite, strontium ferrite, manganese-zinc ferrite, nickel zinc ferrite, cobalt ferrite, or a combination thereof.

8. The method of claim 1, wherein the polymer material comprises a polyaniline, a polypyrrole, a polyacetylene, a polythiophene, or combinations thereof.

9. The method of claim 1, wherein the first conditions comprise heating to a first temperature of about 10° C. to about 80° C.

10. The method of claim 9, wherein the first conditions further comprise mechanical mixing or ultrasonic mixing of the mixture.

11. The method of claim 1, wherein the second conditions comprise heating to a second temperature of about 10° C. to about 80° C.

12. The method of claim 11, wherein the second conditions further comprise mechanical mixing or ultrasonic mixing of the mixture.

13. A coated substrate, comprising:
    a film comprising a coating composition that comprises an electrically conductive polymer material, a dopant, and a magnetic material at least partially coated with an antioxidant material, wherein
        the antioxidant material is selected from the group consisting of cerium oxide, aluminum oxide, chromium oxide, yttrium oxide, iron oxide, titanium oxide, and combinations thereof, and
        the dopant is selected from the group consisting of sulfonyl diphenol (SDP), p-toluenesulfonic acid (p-TSA), m-cresol, 2-(2-hydroxyphenyl)benzene-1,4-diol, 2-(2-hydroxyethyl)benzene-1,4-diol, 3-ethylphenol, 1-dodecanesulfonic acid, d-camphorsulfonic acid, 2-dodecylbenzenesulfonic acid, 1-anthrol, 2-chlorophenol, benzenesulfonic acid, 2-naphthol, 2-fluorophenol, 3-isopropylphenol, 2-methylbenzenesulfonic acid, phenyl dodecane-1-sulfonate, and combinations thereof, and
    a substrate.

14. The coated substrate of claim 13, wherein the substrate comprises aluminum, aluminum alloy, copper, copper alloy, iron, iron alloy, steel, steel alloy, titanium, titanium alloy, magnesium, magnesium alloy, or combinations thereof.

15. The coated substrate of claim 13, wherein the substrate comprises a portion of an aircraft, a watercraft, a spacecraft, a land vehicle, a satellite, a wind turbine, or consumer electronics.

16. The coated substrate of claim 13, wherein the coated substrate has a resistance of less than 1 MΩ.

17. A method of forming a coated substrate, comprising:
applying a coating composition to a substrate, the coating composition comprising:
a magnetic material at least partially coated with;
an antioxidant material selected from the group consisting of cerium oxide, aluminum oxide, chromium oxide, yttrium oxide, iron oxide, titanium oxide, and combinations thereof; and
an electrically conductive polymer material;
introducing the coated substrate with a dopant, the dopant selected from the group consisting of sulfonyl diphenol (SDP), p-toluenesulfonic acid (p-TSA), m-cresol, 2-(2-hydroxyphenyl)benzene-1,4-diol, 2-(2-hydroxyethyl)benzene-1,4-diol, 3-ethylphenol, 1-dodecanesulfonic acid, d-camphorsulfonic acid, 2-dodecylbenzenesulfonic acid, 1-anthrol, 2-chlorophenol, benzenesulfonic acid, 2-naphthol, 2-fluorophenol, 3-isopropylphenol, 2-methylbenzenesulfonic acid, phenyl dodecane-1-sulfonate, and combinations thereof; and
curing the coating composition with the substrate, under curing conditions, to form a coated substrate.

18. The method of claim 17, wherein the substrate comprises aluminum, aluminum alloy, copper, copper alloy, iron, iron alloy, steel, steel alloy, titanium, titanium alloy, magnesium, magnesium alloy, or a combination thereof.

19. The method of claim 17, wherein the magnetic material comprises iron, an iron alloy, nickel, a nickel alloy, cobalt, a cobalt alloy, an iron oxide, a hexagonal ferrite, or combinations thereof.

20. The method of claim 17, wherein the electrically conductive polymer material comprises a polyaniline, a polypyrrole, a polyacetylene, a polythiophene, or combinations thereof.

* * * * *